(12) United States Patent
Carey et al.

(10) Patent No.: US 11,602,072 B1
(45) Date of Patent: Mar. 7, 2023

(54) INFORMATION HANDLING SYSTEM WITH VIBRATION REDUCTION IN A FAN CARRIER

(71) Applicant: Dell Products L.P., Round Rock, TX (US)

(72) Inventors: Daniel J. Carey, Austin, TX (US); Jean Marie Doglio, Round Rock, TX (US); Paul Allen Waters, Austin, TX (US); Juan M. Gonzalez, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/501,207

(22) Filed: Oct. 14, 2021

(51) Int. Cl.
*H05K 7/20* (2006.01)

(52) U.S. Cl.
CPC ..... *H05K 7/20172* (2013.01); *H05K 7/20727* (2013.01)

(58) Field of Classification Search
CPC ............. H05K 7/20172; H05K 7/20727
See application file for complete search history.

(56) References Cited

U.S. PATENT DOCUMENTS

| 10,485,136 | B2 * | 11/2019 | Gopalakrishna | ........ G06F 1/181 |
| 11,019,748 | B2 * | 5/2021 | Awaru | ................. H05K 7/1489 |
| 2018/0080480 | A1 | 3/2018 | Doglio | |
| 2020/0318654 | A1 | 10/2020 | Hsieh et al. | |

* cited by examiner

*Primary Examiner* — Mukundbhai G Patel
(74) *Attorney, Agent, or Firm* — Larson Newman, LLP

(57) ABSTRACT

A fan carrier includes a fan mounting section, a connector mounting section, and a connecting section. The fan mounting section is placed in physical communication with a fan of an information handling system. The fan mounting section has both structural rigidity and vibration rigidity. The connector mounting section is placed in physical communication with a fan-side connector of the information handling system. The connector mounting section has structural rigidity to properly align the fan-side connector with a motherboard-side connector of the information handling system. The connecting section is in physical communication with and located in between the fan mounting section and the connector mounting section. The connecting section has structural rigidity and vibration flexibility, and the vibration flexibility reduces vibrations from the fan before the vibrations are transmitted to the fan-side connector.

20 Claims, 4 Drawing Sheets

INFORMATION HANDLING SYSTEM WITH VIBRATION REDUCTION IN A FAN CARRIER

FIELD OF THE DISCLOSURE

The present disclosure generally relates to information handling systems, and more particularly relates to an information handling system with vibration reduction in a fan carrier.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems. Information handling systems can also implement various virtualized architectures. Data and voice communications among information handling systems may be via networks that are wired, wireless, or some combination.

SUMMARY

A fan carrier includes a fan mounting section, a connector mounting section, and a connecting section. The fan mounting section may be placed in physical communication with a fan of an information handling system. The fan mounting section may have both structural rigidity and vibration rigidity. The connector mounting section may be placed in physical communication with a fan-side connector of the information handling system. The connector mounting section may have structural rigidity to properly align the fan-side connector with a motherboard-side connector of the information handling system. The connecting section is in physical communication with and located in between the fan mounting section and the connector mounting section. The connecting section may have structural rigidity and vibration flexibility, and the vibration flexibility may reduce vibrations from the fan before the vibrations are transmitted to the fan-side connector.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Figure 1:
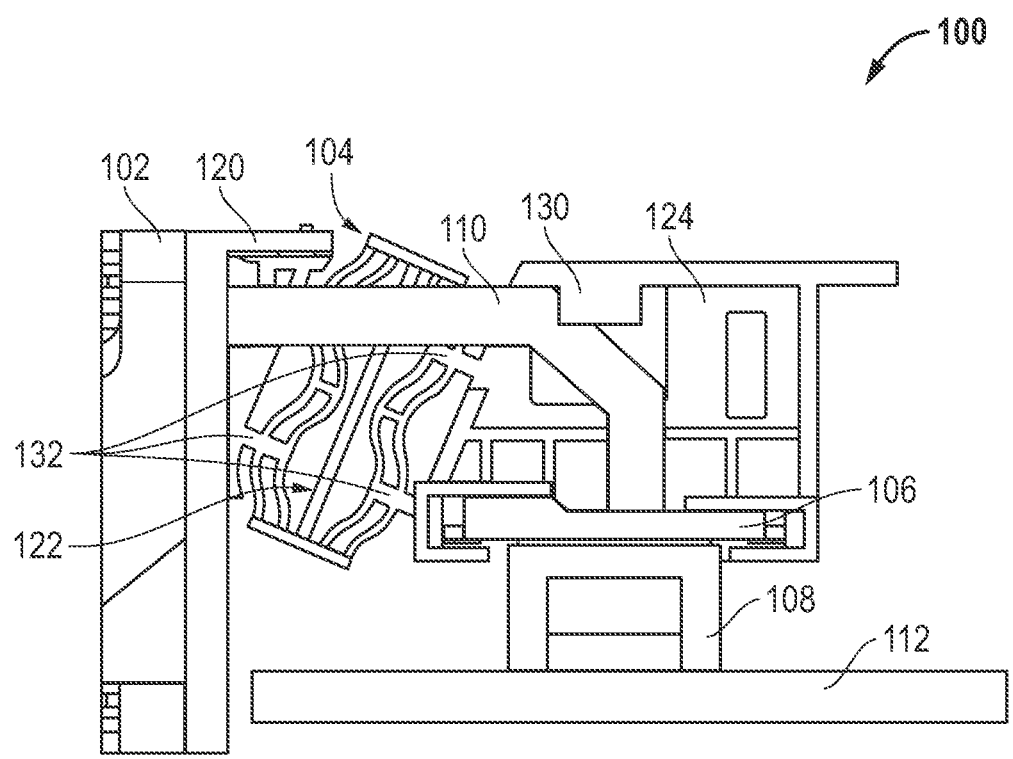
FIG. 1 is a side view of a fan coupled to a motherboard of an information handling system via connectors and a fan carrier according to at least one embodiment of the disclosure.
Figure 2:
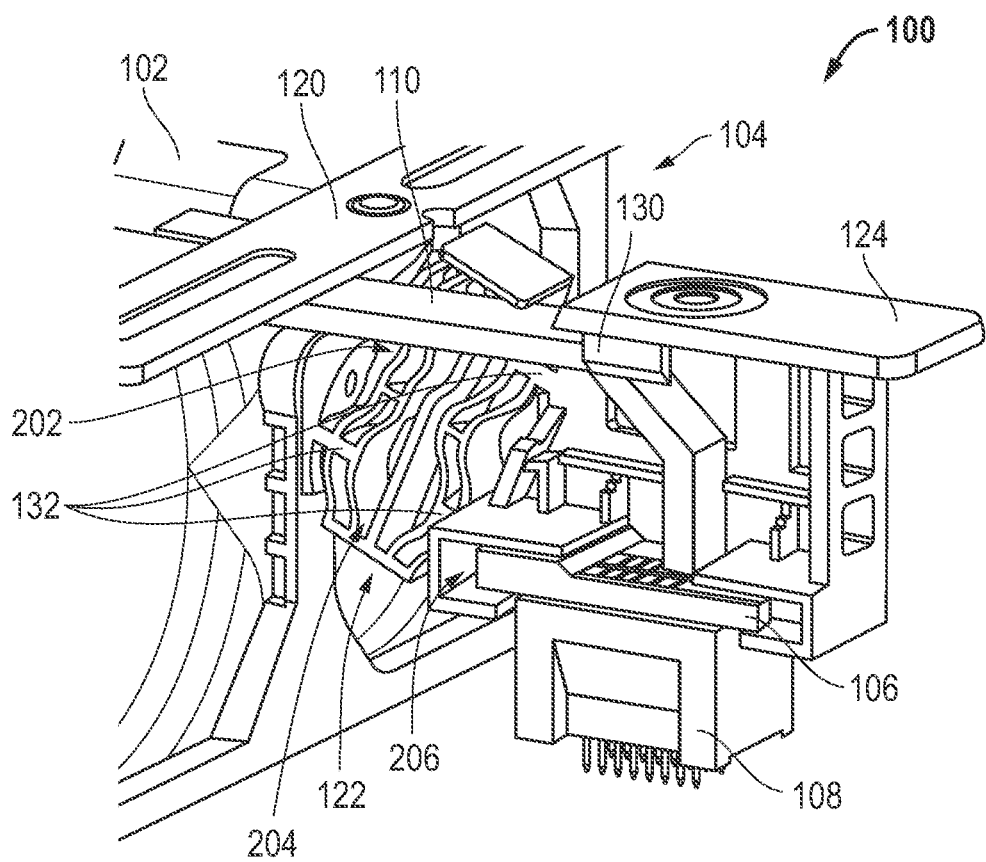
FIG. 2 is a perspective view of the fan, the fan carrier and the connectors according to at least one embodiment of the present disclosure.

FIGS. 1 and 2 illustrate a portion of an information handling system 100 including a fan 102, a fan carrier 104, a fan-side connector 106, a motherboard (MB)-side connector 108, cables 110, and a portion of a motherboard 112 according to at least one embodiment of the disclosure. For purpose of this disclosure information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system can be a personal computer, a laptop computer, a smart phone, a tablet device or other consumer electronic device, a network server, a network storage device, a switch, a router, or another network communication device, or any other suitable device and may vary in size, shape, performance, functionality, and price.

Fan carrier 104 includes a fan mounting section 120, a connecting section 122, and a connector mounting section 124. Connector mounting section 124 includes a cable routing channel 130 to route cables 110 from fan-side connector 106 to fan 102. In an example, motherboard 112 may control fan 102 via a communication path formed by MB-side connector 108, fan-side connector 106, and cables 110.

In previous information handling systems, vibration energy from a fan would travel through the fan carrier and transfer to the fan-side connector. In this situation, the fan-side connector would vibrate relative to the MB-side connector, which in turn would fret and wear the pins/contacts between the connectors. In previous information handling systems, the fan would fail because of a communication loss between the motherboard and fan cause by the wear to pins/contacts between the connectors. Information handling system 100 may be improved by connecting section 122 altering a natural frequency of fan carrier 104, which may enable the connecting section to disrupt vibration transmissions from fan 102 to fan-side connector 106.

Connecting section 122 may also be structurally rigid to enable fan-side connector 106 to blind-mate with MB-side connector 108.

In certain examples, fan-side connector 106 and MB-side connector 108 may be a blind-mate assembly, such that an individual may not be able to see the alignment of the connectors when fan 102 and fan carrier 104 are mounted on motherboard 112. As described below, fan mounting section 120, connecting section 122, and connector mounting section 124 may be structurally rigid to provide a reliable way to fully seat fan-side connector 106 within MB-side connector 108.

Referring to FIG. 1, fan mounting section 120 may connect fan carrier 104 to fan 102. Fan mounting section 120 may have both structural and vibrational rigidity. In an example, structural rigidity of fan mounting section 120 may enable the fan mounting section to support the weight of fan 102 without bending or breaking. Vibrational rigidity of fan mounting section 120 may cause this section of fan carrier 104 to transmit vibration energy from fan 102 to other sections of the fan carrier.

In an example, connecting section 122 may connect fan mounting section 120 with connector mounting section 124. Connecting section 122 may have both structural rigidity and vibrational flexibility. In an example, structural rigidity of connecting section 122 may enable the connecting section to enable a blind-mate connection between fan-side connector 106 and MB-side connector 108. In certain examples, connecting section 122 includes lateral supports 132 to provide the structural rigidity, which in turn may resist motion in fan carrier 104 that would allow fan-side connector 106 to be misaligned during the blind-mate installation of fan 102. Vibrational flexibility of connecting section 122 may decouple fan mounting section 120 from connector mounting section 124 with respect to transmission of vibrations or vibration energy from fan 102. In an example, the structure of connecting section 122 may create the vibrational flexibility, which in turn may result in a low vibrational stiffness of the connecting section to decouple fan mounting section 120 from connector mounting section 124. The structure of connecting section 122 may be any suitable elements to have the low vibrational stiffness, including geometrical elements with low vibrational stiffness.

In an example, wear on the pins/contacts of fan-side connector 106 and MB-side connector 108 may be based on any suitable factors including, but not limited to, a total normal load on the contacts, a sliding distance of the contacts, a hardness or softness of the contacting surface, and a number of oscillations. In certain examples, while all these factors may contribute to the wear of the contacts of fan-side connector 106 and MB-side connector 108, the wear may be proportional to the sliding distance between the contacts and a number of oscillations. In an example, the reduction of the sliding distance may minimize relative movement between fan-side connector 106 and MB-side connector 108. Connecting section 122 may be utilized to reduce vibrations in fan-side connector 106, such that both the sliding distance and the number of oscillations experienced by the fan-side connector relative to MB-side connector 108 may be reduced. The wear of contacts in fan-side connector 106 and the contacts in MB-side connector 108 may be reduced based on the reduction of the sliding distance and the number of oscillations.

In an example, connector mounting section 124 may hold fan-side connector 106 within fan carrier 104. Connector mounting section 124 may have both structural and vibrational rigidity. In an example, structural rigidity of connector mounting section 124 may enable the connector mounting section to hold fan-side connector 106 in a proper alignment for mating with MB-side connector 108 of motherboard 112. Vibrational rigidity of connector mounting section 124 may cause this section of fan carrier 104 to transmit vibration energy. However, connecting section 122 may have already reduced the vibration energy from fan 102 to a level that may not cause wear on the contacts of fan-side connector 106. Thus, connector mounting section 124 may have vibration rigidity without causing damage to fan-side connector 106. In an example, connector mounting section 124 may have vibrational flexibility without varying from the scope of this disclosure.

One of ordinary skill in the art will recognize that while this disclosure discusses fan 102 and fan carrier 104 transmitting vibrations to fan-side connector 106, the disclosure may apply to any vibration source and an affected structure without varying from the scope of this disclosure. Fan 102 and fan carrier 104 may be referred to as a vibration source and fan-side connector 106 may be referred to as an affected structure.

Referring to FIG. 2, connecting section 122 includes a cable cutout 202 and a geometric structure 204. In an example, geometric structure 204 may be any suitable geometric shape including, but not limited to, an accordion shape. In certain examples, geometric structure 204 may reduce vibration energy from fan 102 in any suitable manner. For example, the shape of geometric structure 204 may lower the stiffness of connecting section 122 and thereby lower the natural frequency of the connecting section. In this example, the lower stiffness of geometric structure 204 may disrupt the vibration path between fan 102 and fan-side connector 106. The lower stiffness of connecting section 122 may cause the vibration energy of fan 102 to be consumed by moving the fan instead of being transmitting to fan-side connector 106. In an example, connecting section 122 may not lower the vibration energy but change a location that the energy is concentrated, such as the fan instead of the fan-side connector. In this example, the vibrations do not cause fan-side connector 106 to move relative to MB-side connector 108. The lack of movement, or negligible amount of movement, of fan-side connector 106 may prevent wear on the contacts of the fan-side connector and the contacts of MB-side connector 108.

Connector mounting section 124 includes a connector insert 206 to receive fan-side connector 106. In an example, connector insert 206 may be in physical communication with fan-side connector 106 to hold the fan-side connector in a proper alignment position. The proper alignment position may enable the blind-mate connection between fan-side connector 106 and MB-side connector 108.

Figure 3:
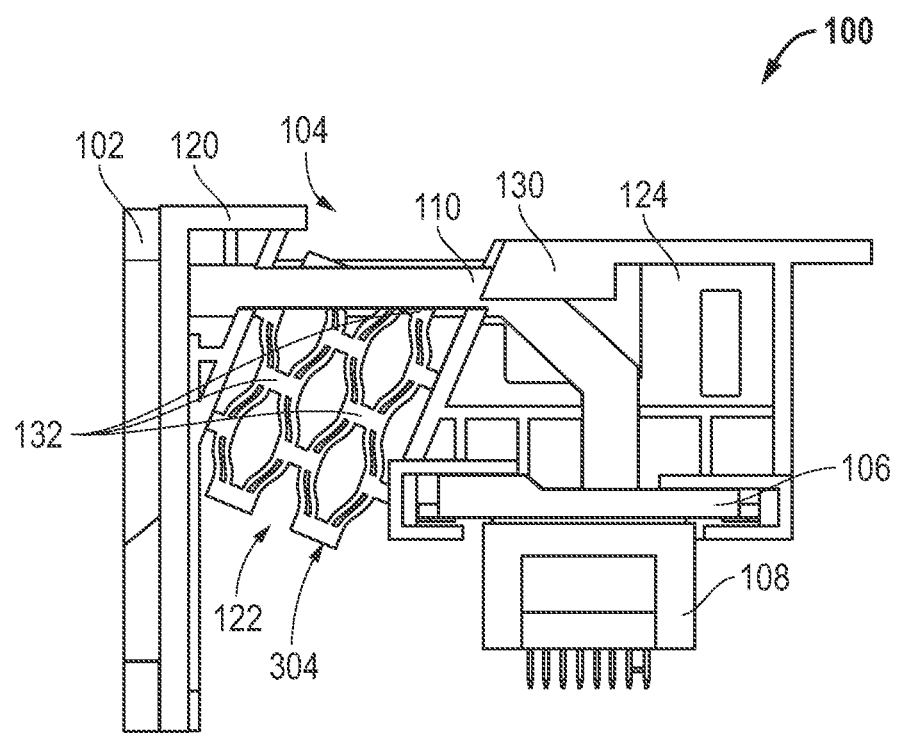
FIG. 3 is a side view of an embodiment of a connecting section of the fan carrier according to at least one embodiment of the present disclosure.
Figure 4:
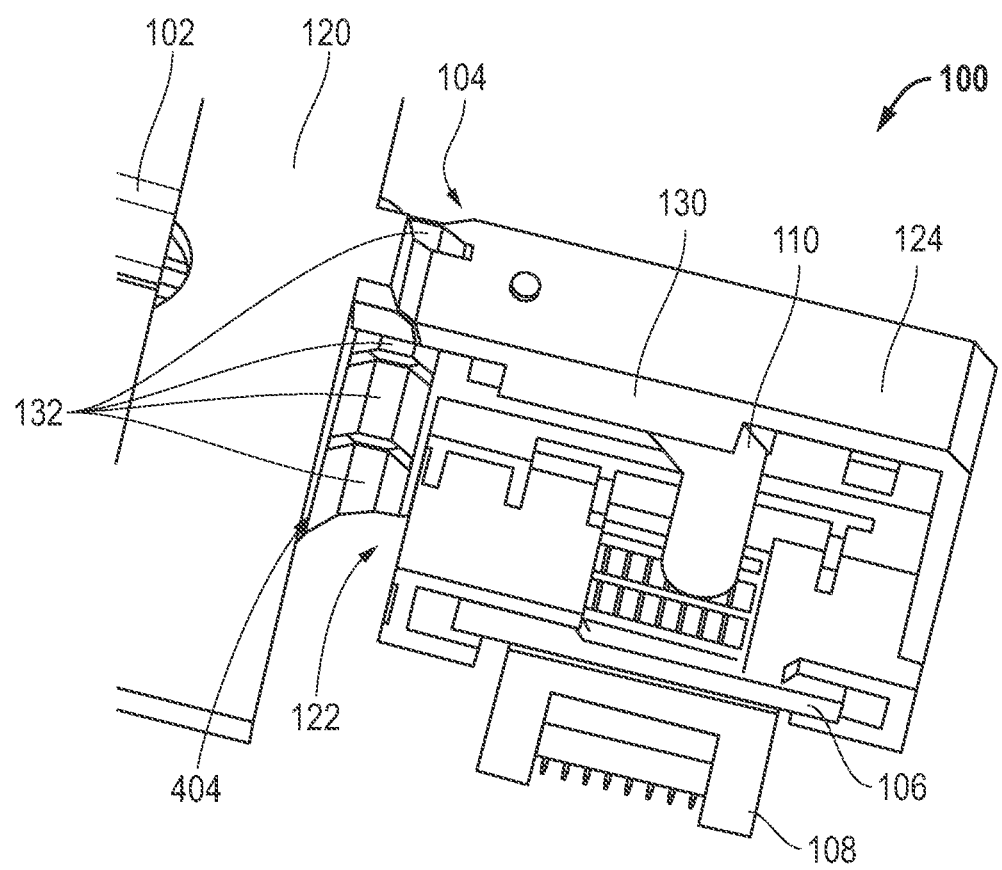
FIG. 4 is a top view of another embodiment of the connecting section of the fan carrier according to at least one embodiment of the present disclosure.

FIGS. 3 and 4 illustrate a portion of information handling system 100 including fan 102, fan carrier 104, fan-side connector 106, MB-side connector 108, and cables 110 according to at least one embodiment of the disclosure. Referring to FIG. 3, connecting section 122 includes a geometric structure 304 as will be described below. In an example, fan mounting section 120 may connect fan carrier 104 to fan 102. Fan mounting section 120 may have both structural and vibrational rigidity. In an example, structural rigidity of fan mounting section 120 may enable the fan mounting section to support the weight of fan 102 without bending or breaking. Vibrational rigidity of fan mounting section 120 may cause this section of fan carrier 104 to transmit vibration energy from fan 102 to other sections of the fan carrier.

In an example, connecting section 122 may connect fan mounting section 120 with connector mounting section 124. Connecting section 122 may have both structural rigidity and vibrational flexibility. In an example, structural rigidity of connecting section 122 may enable the connecting section to enable a blind-mate connection between fan-side connector 106 and MB-side connector 108. Lateral supports 132 of connecting section 122 may provide the structural rigidity, which in turn may resist motion in fan carrier 104 that would allow fan-side connector 106 to be misaligned during the blind-mate installation of fan 102.

Geometric structure 304 may be any suitable geometric shape including, but not limited to, a honeycomb shape. Vibrational flexibility in geometric structure 304 of connecting section 122 may decouple fan mounting section 120 from connector mounting section 124 with respect to transmission of vibrations or vibration energy from fan 102. In an example, geometric structure 304 of connecting section 122 may create the vibrational flexibility, which in turn may result in a low vibrational stiffness of the connecting section to decouple fan mounting section 120 from connector mounting section 124. Geometric structure 304 of connecting section 122 may have a different vibrational response than geometric structure 204 of FIG. 2 based on each structure having a different natural mode, which in turn may create a different natural mode of fan carrier 104. In an example, the different natural mode may not be sensitive in the frequency range of the vibrations of fan 102. In an example, the natural mode of a geometric structure may vary based on a number, size, aspect ratio, and geometric properties of the particular geometric structure.

In an example, connector mounting section 124 may hold fan-side connector 106 within fan carrier 104. Connector mounting section 124 includes a cable routing channel 130 to route cables 110 from fan-side connector 106 to fan 102. Connector mounting section 124 may have both structural and vibrational rigidity. In an example, structural rigidity of connector mounting section 124 may enable the connector mounting section to hold fan-side connector 106 in a proper alignment for mating with MB-side connector 108 of motherboard 112.

Referring to FIG. 4, connecting section 122 includes a geometric structure 404 as will be described below. In an example, fan mounting section 120 may connect fan carrier 104 to fan 102. Fan mounting section 120 may have both structural and vibrational rigidity. In an example, structural rigidity of fan mounting section 120 may enable the fan mounting section to support the weight of fan 102 without bending or breaking. Vibrational rigidity of fan mounting section 120 may cause this section of fan carrier 104 to transmit vibration energy from fan 102 to other sections of the fan carrier.

In an example, connecting section 122 may connect fan mounting section 120 with connector mounting section 124. Connecting section 122 may have both structural rigidity and vibrational flexibility. In an example, structural rigidity of connecting section 122 may enable the connecting section to enable a blind-mate connection between fan-side connector 106 and MB-side connector 108. Lateral supports 132 of connecting section 122 may provide the structural rigidity, which in turn may resist motion in fan carrier 104 that would allow fan-side connector 106 to be misaligned during the blind-mate installation of fan 102.

Geometric structure 404 may be any suitable geometric shape including, but not limited to, a necked-down shape. Vibrational flexibility in geometric structure 404 of connecting section 122 may decouple fan mounting section 120 from connector mounting section 124 with respect to transmission of vibrations or vibration energy from fan 102. The necked-down shape of geometric shape 404 may resembling a living hinge and may have a different natural mode from both geometric structure 204 of FIG. 2 and geometric structure 304 of FIG. 3, which in turn may create a different natural mode of fan carrier 104. In an example, the different natural mode may not be sensitive in the frequency range of the vibrations of fan 102. In an example, geometric structure 404 of connecting section 122 may create the vibrational flexibility, which in turn may result in a low vibrational stiffness of the connecting section to decouple fan mounting section 120 from connector mounting section 124.

In an example, connector mounting section 124 may hold fan-side connector 106 within fan carrier 104. Connector mounting section 124 includes a cable routing channel 130 to route cables 110 from fan-side connector 106 to fan 102. Connector mounting section 124 may have both structural and vibrational rigidity. In an example, structural rigidity of connector mounting section 124 may enable the connector mounting section to hold fan-side connector 106 in a proper alignment for mating with MB-side connector 108 of motherboard 112.

As stated above, connecting section 122 of fan carrier 104 may be utilized to reduce vibrations in fan-side connector 106, such that both the sliding distance and the number of oscillations experienced by the fan-side connector relative to MB-side connector 108 may be reduced. In an example, the wear of contacts in fan-side connector 106 and the contacts in MB-side connector 108 may be reduced based on the reduction of the sliding distance and the number of oscillations. Connecting section 122 may include any number, size, aspect ratio, and geometrical structures to create low stiffness elements. In an example, the low stiffness element may disrupt the vibrations from fan 102 to fan-side connector 106. In an example, connecting section 122 may include vibration damping properties if the geometrical structures are made from different materials, if the mass of the connecting structure is altered, or like. In an example, connecting section 124 may include one or more lateral supports 132 to provide a structural rigidity for proper alignment of fan-side connector 106 with MB-side connector 108.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A fan carrier to be placed in physical communication with both a fan-side connector and with a fan of an information handling system, the fan carrier comprising:
   a fan mounting section to be placed in physical communication with the fan, the fan mounting section having both structural rigidity and vibration rigidity;
   a connector mounting section to be placed in physical communication with the fan-side connector, the connector mounting section having structural rigidity to align the fan-side connector with a motherboard-side connector; and a connecting section in physical communication with and located in between the fan mounting section and the connector mounting section, the connecting section having structural rigidity and vibration flexibility, wherein the vibration flexibility reduces vibrations from the fan before the vibrations are transmitted to the fan-side connector.

2. The fan carrier of claim 1, wherein the connecting section includes:
   a geometric structure to provide the vibration flexibility of the connecting section; and
   a lateral support to provide the structural rigidity of the connecting section.

3. The fan carrier of claim 2, wherein a shape of the geometric structure increases a frequency of the vibrations and thereby lowers an amplitude of the vibrations.

4. The fan carrier of claim 2, wherein a vibration response to the connecting section is based on a number, a size, an aspect ratio, and geometric properties of the geometric structure.

5. The fan carrier of claim 2, wherein the geometric structure has an accordion shape.

6. The fan carrier of claim 2, wherein the geometric structure has a honeycomb shape.

7. The fan carrier of claim 1, wherein the connector mounting section includes:
   a connector insert to receive the fan-side connector and to hold the fan-side connector in a proper alignment position for a connection with the motherboard-side connector.

8. The fan carrier of claim 1, the connector mounting section includes:
   a cable routing channel to route one or more cables from the fan-side connector to the fan.

9. An information handling system comprising:
   a fan;
   a motherboard to communicate with the fan via a motherboard-side connector, a fan-side connector, and a cable; and
   a fan carrier including:
      a fan mounting section to be placed in physical communication with the fan, the fan mounting section having both structural rigidity and vibration rigidity;
      a connector mounting section to be placed in physical communication with the fan-side connector, the connector mounting section having structural rigidity to align the fan-side connector with a motherboard-side connector; and
      a connecting section in physical communication with and located in between the fan mounting section and the connector mounting section, the connecting section having structural rigidity and vibration flexibility, wherein the vibration flexibility reduces vibrations from the fan before the vibrations are transmitted to the fan-side connector.

10. The information handling system of claim 9, wherein the connecting section includes:
    a geometric structure to provide the vibration flexibility of the connecting section; and
    a lateral support to provide the structural rigidity of the connecting section.

11. The information handling system of claim 10, wherein a shape of the geometric structure increases a frequency of the vibrations and thereby lowers an amplitude of the vibrations.

12. The information handling system of claim 10, wherein a vibration response to the connecting section is based on a number, a size, an aspect ratio, and geometric properties of the geometric structure.

13. The information handling system of claim 10, wherein the geometric structure has an accordion shape.

14. The information handling system of claim 10, wherein the geometric structure has a honeycomb shape.

15. The information handling system of claim 9, wherein the connector mounting section includes:
    a connector insert to receive the fan-side connector and to hold the fan-side connector in a proper alignment position for a connection with the motherboard-side connector.

16. The information handling system of claim 9, the connector mounting section includes:
    a cable routing channel to route one or more cables from the fan-side connector to the fan.

17. An information handling system comprising:
    a motherboard to communicate with a fan via a motherboard-side connector, a fan-side connector, and a cable; and
    a fan carrier including:
       a fan mounting section to be placed in physical communication with the fan, the fan mounting section having both structural rigidity and vibration rigidity;
       a connector mounting section to be placed in physical communication with the fan-side connector, the connector mounting section having structural rigidity to properly align the fan-side connector with a motherboard-side connector, the connector mounting section including:
          a connector insert to receive the fan-side connector and to hold the fan-side connector in a proper alignment position for a connection with the motherboard-side connector; and
       a connecting section in physical communication with and located in between the fan mounting section and the connector mounting section, the connecting section including:
          a lateral support to provide structural rigidity to the connecting section; and
          a geometric structure to provide vibration flexibility to the connecting section, wherein the vibration flexibility reduces vibrations from the fan before the vibrations are transmitted to the fan-side connector.

18. The information handling system of claim 17, wherein a shape of the geometric structure increases a frequency of the vibrations and thereby lowers an amplitude of the vibrations.

19. The information handling system of claim 17, wherein a vibration response to the connecting section is based on a number, a size, an aspect ratio, and geometric properties of the geometric structure.

20. The information handling system of claim 17, wherein the connector mounting section includes a cable routing channel to route one or more cables from the fan-side connector to the fan.

* * * * *